(12) United States Patent
Mok et al.

(10) Patent No.: US 8,198,550 B2
(45) Date of Patent: Jun. 12, 2012

(54) PRINTED CIRCUIT BOARD AND METHOD OF MANUFACTURING THE SAME

(75) Inventors: Jee Soo Mok, Gyunggi-do (KR); Je Gwang Yoo, Gyunggi-do (KR); Chang Sup Ryu, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 474 days.

(21) Appl. No.: 12/385,003

(22) Filed: Mar. 27, 2009

(65) Prior Publication Data
US 2010/0175915 A1 Jul. 15, 2010

(30) Foreign Application Priority Data

Jan. 9, 2009 (KR) .................. 10-2009-0001971

(51) Int. Cl.
*H01R 12/04* (2006.01)
(52) U.S. Cl. ....................................... 174/262
(58) Field of Classification Search .............. 174/262, 174/258, 259, 2, 263; 361/792; 438/622, 438/624
See application file for complete search history.

(56) References Cited

U.S. PATENT DOCUMENTS

| | | | | |
|---|---|---|---|---|
| 5,535,101 | A * | 7/1996 | Miles et al. | 361/808 |
| 6,418,615 | B1 * | 7/2002 | Rokugawa et al. | 29/852 |
| 7,208,341 | B2 * | 4/2007 | Lee et al. | 438/106 |
| 7,420,126 | B2 * | 9/2008 | Shibata et al. | 174/255 |
| 7,728,234 | B2 * | 6/2010 | Wang | 174/262 |
| 7,838,779 | B2 * | 11/2010 | Yamamichi et al. | 174/264 |
| 2010/0175915 | A1 * | 7/2010 | Mok et al. | 174/258 |
| 2011/0005824 | A1 * | 1/2011 | An et al. | 174/261 |

* cited by examiner

*Primary Examiner* — Neil Abrams

(57) ABSTRACT

A printed circuit board and a method of manufacturing the printed circuit board, in which the printed circuit board includes an insulating layer, a circuit layer embedded in the insulating layer and having a connection pad that is embedded in the insulating layer such that one side of the connection pad is flush with a surface of the insulating layer, and insulating materials configured to protect the circuit layer from an external environment and having an opening through which the connection pad is exposed. The manufacturing process includes a step of pressing the circuit layer and the insulating material into the insulating layer to form a level surface while leaving the connection pads flush at the surface. The method makes the printed circuit board slim, and increases reliability and the degree of design freedom.

6 Claims, 4 Drawing Sheets

PRINTED CIRCUIT BOARD AND METHOD OF MANUFACTURING THE SAME

CROSS REFERENCE TO RELATED APPLICATION

This application claims the benefit of Korean Patent Application No. 10-2009-0001971, filed Jan. 9, 2009, entitled "A printed circuit board and a fabricating method the same", which is hereby incorporated by reference in its entirety into this application.

BACKGROUND OF THE INVENTION

1. Field of the Invention

The present invention relates to a printed circuit board and a method of manufacturing the printed circuit board.

2. Description of the Related Art

Recently, demands for a technology which directly mounts a semiconductor chip on a printed circuit board has been increasing in response to the development of highly-densified semiconductor chips and the high-speed transmission of signals. Consequently, the development of printed circuit boards of a high density and high reliability which are suitable to highly-densified semiconductor chips is required.

Requirements for a printed circuit board of a high density and reliability are closely related to the specifications of the desired semiconductor chip. The printed circuit board having high density and high reliability must further be developed to have many characteristics such as the implementation of fine circuits, excellent electrical properties, structure for high-speed transmission of signals, high reliability, high performance, slimness and the like. Accordingly, a technology for printed circuit board which is capable of forming fine circuit patterns and micro via-holes is required in order to meet these needs.

FIGS. 1 to 5 are cross-sectional views showing a conventional process of manufacturing a printed circuit board. The conventional process of manufacturing a printed circuit board will now be described with reference to the drawings.

First, as shown in FIG. 1, a copper clad laminate which comprises an insulating layer 12 and copper layers 14 disposed on the insulating layer 12 is prepared.

As shown in FIG. 2, a via-hole 16 for the interlayer electrical connection is formed in the copper clad laminate using mechanical drilling or laser machining.

As shown in FIG. 3, a plated layer 18 is applied on the inner wall of the via-hole 16 as well as the copper layer 14. In this regard, the plated layer 18 includes an electroless plated layer formed by an electroless plating process and an electrolytic plated layer formed by an electrolytic plating process. For the convenience of explanation, the plated layer 18 is shown in FIG. 3 as being composed of a single plated layer.

As shown in FIG. 4, the copper layer 14 and the plated layer 18 are patterned to create a circuit layer 20.

Finally, as shown in FIG. 5, a solder resist layer 22 having an opening 24 through which a pad part of the circuit layer 20 is exposed is disposed on the insulating layer 12, thus finishing a printed circuit board 50.

The printed circuit board which is manufactured through the conventional process is configured such that the circuit layer 20 including the pad part is formed on the insulating layer 12 and the solder resist layer 22 for protecting the outermost circuit layer 20 is formed on the insulating layer 12. Consequently, the printed circuit board 50 configured in this manner is problematic in that its thickness is increased and reliability of the high density circuit is deteriorated.

Furthermore, since the printed circuit board is configured such that the pad part and the solder resist layer 50 are formed on the insulating layer 12, stepped portions occur in the course of machining the openings 24 through which the pad part is exposed, thus making printability of external connection terminals uneven. In addition, since the openings must be machined while taking into consideration manufacturing error, the openings 24 are inevitably made larger than the pad part, thus reducing a degree of freedom in the design of the openings 24.

SUMMARY OF THE INVENTION

Accordingly, the present invention has been made keeping in mind the above problems occurring in the related art, and the present invention provides a printed circuit board and a method of manufacturing the same which enable configuration into a slim structure and improving the reliability of a high-density circuit.

Furthermore, the present invention provides a printed circuit board and a method of manufacturing the same in which a circuit layer and a solder resist layer are embedded in an insulating layer such that there is no stepped portion between a pad part and the solder resist layer, thus increasing a degree of freedom of design.

In an aspect, the present invention provides a printed circuit board including: an insulating layer; at least one circuit layer embedded in the insulating layer and having a connection pad that is embedded in the insulating layer such that one side of the connection pad is flush with a surface of the insulating layer; and a insulating materials configured to protect the circuit layer from an external environment and having an opening through which the connection pad is exposed.

The at least one circuit layer may include a first circuit layer disposed on one side of the insulating layer and a second circuit layer disposed on the other side of the insulating layer, and the insulating layer may include a bump for connecting the first circuit layer with the second circuit layer.

The one side of the connection pad which is flush with the insulating layer may act as an exposed surface to which an external terminal is bonded.

The insulating materials may be flush at one side with the insulating layer and may be embedded at the other side in the insulating layer.

The at least one circuit layer may be formed on the other side of the insulating materials and may be embedded in the insulating layer.

The at least one circuit layer may be embedded in the insulating materials.

The insulating layer may include photosensitive insulating material.

In another aspect, the present invention provides a method of manufacturing a printed circuit board, including: (A) forming at least one circuit layer on a semi-cured insulating layer, the circuit layer having a connection pad; (B) forming insulating materials on the insulating layer, the insulating materials having an opening through which the connection pad is exposed; and (C) pressing and embedding the circuit layer and the insulating materials into the insulating layer.

The circuit layer may include: (A1) printing a first metal layer with a bump; (A2) applying a semi-cured insulating layer on the first metal layer printed with the bump; and (A3) applying a second metal layer on the insulating layer and patterning the first and second metal layers to form first and second circuit layers each having a connection pad.

In (C) pressing and embedding the circuit layer and the insulating materials, one side of the connection pad, which is flush with the insulating layer, may act as an exposed surface to which an external terminal is bonded.

The insulating materials may be flush at one side with the insulating layer and may be embedded at the other side in the insulating layer.

The at least one circuit layer may be formed on the other side of the insulating materials and may be embedded in the insulating layer.

The at least one circuit layer may be embedded in the insulating materials.

In (C) pressing and embedding the circuit layer and the insulating materials, the pressing may be executed while the insulating layer is in a semi-cured state.

The insulating materials may be made of photosensitive insulating material.

In the method, (B) forming the insulating materials may include: (B1) applying a photosensitive insulating material on the insulating layer; and (B2) subjecting the photosensitive insulating material to exposure and development processes to form an opening through which the connection pad is exposed.

BRIEF DESCRIPTION OF THE DRAWINGS

The above and other features and advantages of the present invention will be more clearly understood from the following detailed description taken in conjunction with the accompanying drawings, in which.

DESCRIPTION OF THE PREFERRED EMBODIMENTS

Figure 1:
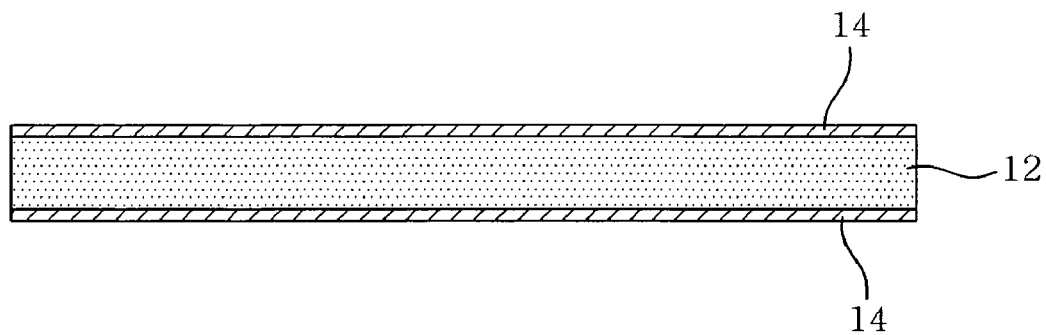
FIGS. 1 to 5 are cross-sectional views showing a conventional process of manufacturing a printed circuit board.
Figure 2:
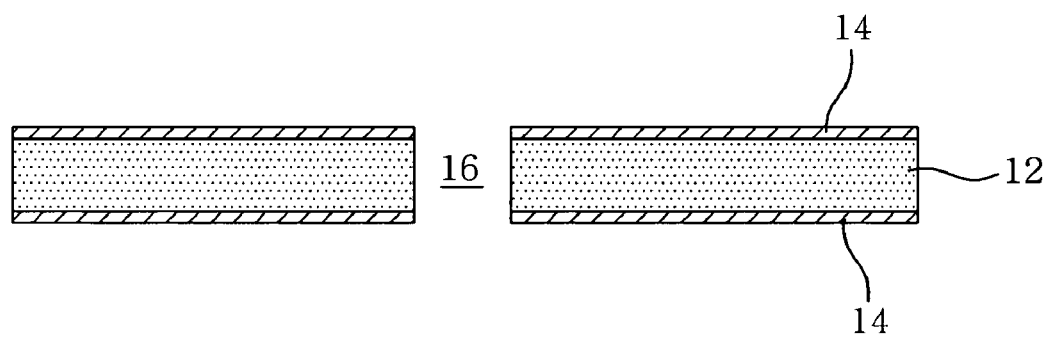
Figure 3:
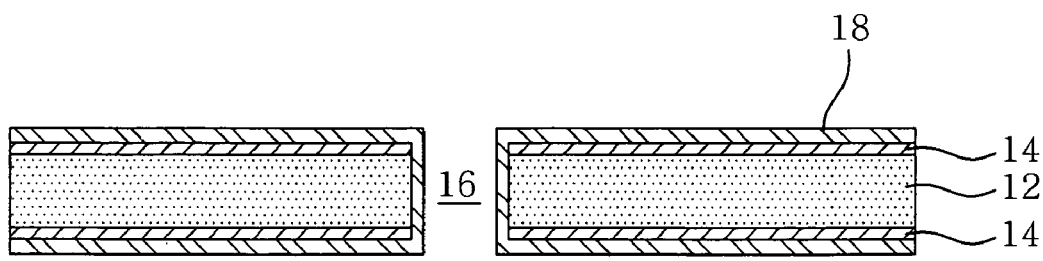
Figure 4:
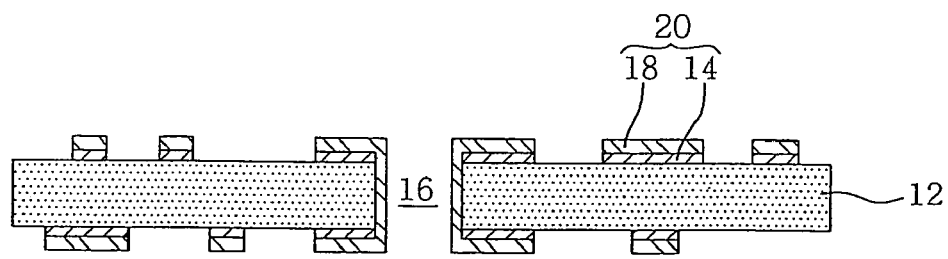
Figure 5:
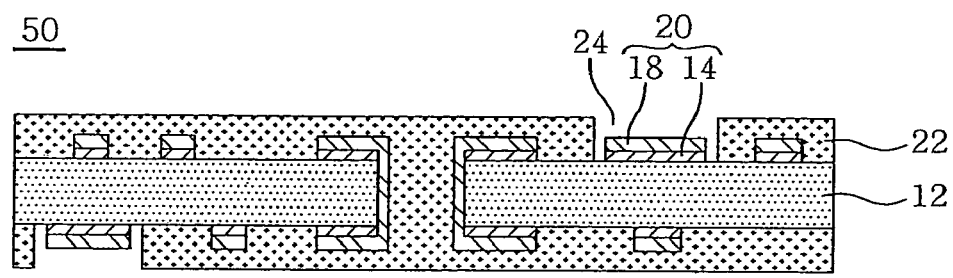

Various advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to best describe the method he or she knows for carrying out the invention.

Concerning the designations of reference numerals in this description, it should be noted that the same reference numerals are used throughout the different drawings to designate the same or similar components. Also, in the description of the present invention, when it is considered that the detailed description of a related prior art may obscure the gist of the present invention, such a detailed description is omitted.

Hereinafter, an embodiment of the present invention will be described in greater detail with reference to the accompanying drawings.

Printed Circuit Board

Figure 6:
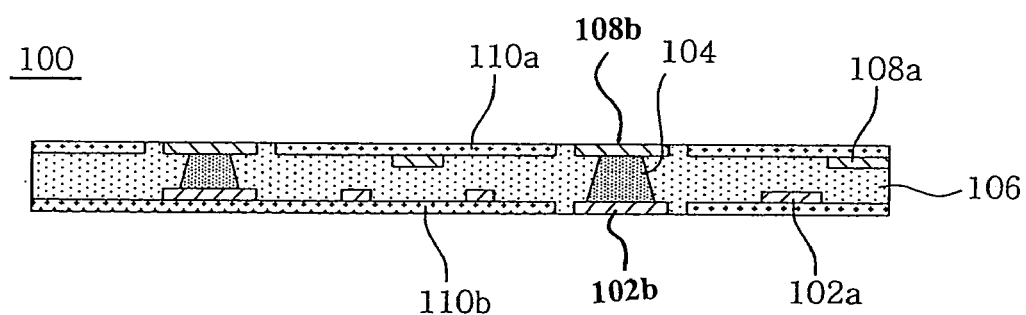
FIG. 6 is a cross-sectional view of a printed circuit board according to an embodiment of the present invention.

FIG. 6 is a cross-sectional view of a printed circuit board according to an embodiment of the present invention. The printed circuit board 100 according to this embodiment is described below with reference to FIG. 6.

As shown in FIG. 6, the printed circuit board 100 according to this embodiment comprises an insulating layer 106, circuit layers 102a, 108a embedded in the insulating layer 106, and insulating materials 110a, 110b embedded in the surface regions of the insulating layer 106 to protect the circuit layers 102a, 108a from the external environment.

The circuit layers 102a, 108a are configured such that the first circuit layer 102a is formed on a side of the insulating layer 106 and the second circuit layer 108a is formed on the other side of the insulating layer 106. The first and second circuit layers 102a, 108a are connected to each other via bumps 104 passing through the insulating layer 106.

Connection pads 102b and 108b of the circuit layers 102a, 108a are embedded in the insulating layer 106 such that external surfaces of the connection pads are flush with the external surfaces of the insulating layer 106. Specifically, one side of the connection pad is flush with the external surface of the insulating layer 106 to offer an exposed surface to which an external connection terminal such as solder ball is bonded, and the other side of the connection pad is embedded in the insulating layer 106.

The insulating materials 110a, 110b are also embedded in the insulating layer 106 such that external sides thereof are flush with the external surfaces of the insulating layer 106 in order to protect the first circuit layer 102a and/or the second circuit layer 108a from the external environment. Specifically, one side of each of the insulating materials 110a, 110b is flush with the external surface of the insulating layer 106, and the other side of the insulating materials is embedded in the insulating layer 106.

Figure 14:
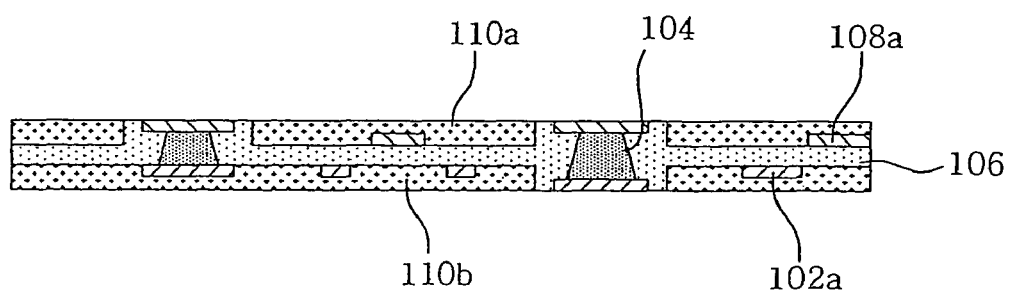

Furthermore, the circuit layers 102a, 108a excluding the connection pads are also embedded in the insulating layer 106 so as not to be exposed to the outside. In this context, there are two manners in which the circuit layers 102a, 108a excluding the connection pads may be embedded in the insulating layer 106 such that the external surfaces thereof are disposed on the other sides, i.e., internal surfaces of the insulating materials 110a, 110b for the protection from the external environment (see FIG. 6) or they are embedded in the insulating materials 110a, 110b (see FIG. 14). In other words, the circuit layers 102a, 108a may have any embedded configuration as long as the circuit layers 102a, 108a are protected from the external environment by the insulating materials 110a, 110b. Although the circuit layers 102a, 108a are shown in FIG. 14 as being entirely embedded in the insulating materials 110a, 110b, circuit layers which are at least partially embedded in the insulating materials 110a, 110b should also be construed as falling within the scope of the present invention.

In this embodiment, the insulating layers 110a, 110b may be composed of photosensitive insulating material.

Although the printed circuit board 100 is shown in FIG. 6 as having a two-layered structure, this is no more than a single exemplary structure. Accordingly, it will be appreciated that the scope of the present invention may include any of various structures wherein a multilayered buildup layer is formed, a connection pad formed on the outermost layer is embedded in an insulating layer so as to be flush with an outermost insulating layer, and an outermost circuit layer is protected by insulating materials embedded in the outermost insulating layer.

Process of Manufacturing the Printed Circuit Board

FIGS. 7 to 14 are cross-sectional views showing a process of manufacturing the printed circuit board shown in FIG. 6. The process is described below with reference to the drawings.

Figure 7:
FIGS. 7 to 14 are cross-sectional views showing a process of manufacturing the printed circuit board shown in FIG. 6.

First, as shown in FIG. 7, a first metal layer 102 is prepared. As this first metal layer 102, a copper layer typically used in the creation of a circuit layer of a printed circuit board may be used.

Figure 8:
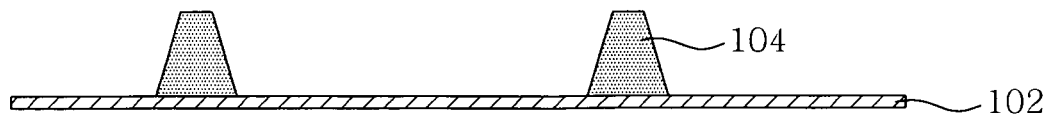

As shown in FIG. 8, bumps 104 are formed on the first metal layer 102.

In this regard, the bumps 104 may be formed using a screen print technology. The screen print technology is executed in a manner such that conductive paste is transferred to the metal layer through openings of a mask. Specifically, openings of the mask are aligned with the metal layer 102, and then conductive paste is applied onto the mask. Subsequently, the conductive paste is wiped using a squeegee, so that the conductive paste is extruded through the openings of the mask and is then transferred to the first metal layer 102 into a pattern having the desired shape and height. Of course, it is to be noted that a process of forming the bumps 104 through any other of known technologies also falls within the scope of the present invention.

The conductive paste that constitutes the bumps 104 may include any conductive material, for example, one selected from among Ag, Pd, Pt, Ni and Ag/Pd.

Figure 9:
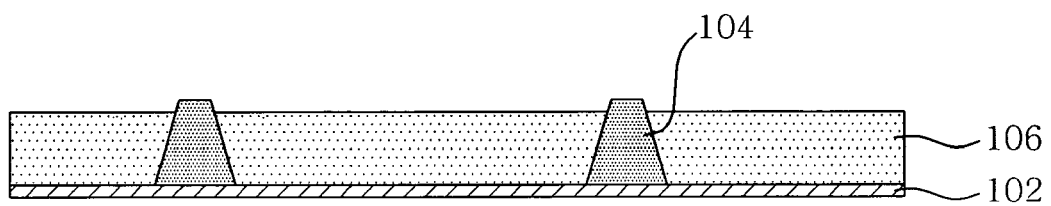

As shown in FIG. 9, an insulating layer 106 is applied onto the first metal layer 102 on which the bumps 104 were formed.

At this point, the insulating layer 106 may be configured such that its thickness is less than the height of the bumps 104, and may be formed in a contact or noncontact way.

The process of contact way formation is executed in a manner such that the insulating layer 106 is applied onto the first metal layer 102 on which the bumps 104 were formed. At this point, the bumps 104 may have a rigidity higher than that of the insulating layer 106 such that the bumps 104 penetrate through the insulating layer 106, and the insulating layer 106 may be embodied as a semi-cured prepreg made of thermosetting resin. In this embodiment, since the insulating layer 106 has a thickness less than the height of the bumps 104, the bumps protrude from the insulating layer 106 by the difference therebetween.

The process of noncontact way formation is executed in a manner such that the metal layer is coated with insulating resin powder using an ink-jet print technology. This process is advantageous in that it minimizes problems such as deformation of the bumps and generation of fine gaps between the bumps 104 and the insulating layer 16 which may otherwise occur in the process of the contact way in which the bumps 104 are under pressure from the insulating layer 106 while penetrating through the insulating layer 106.

Figure 10:
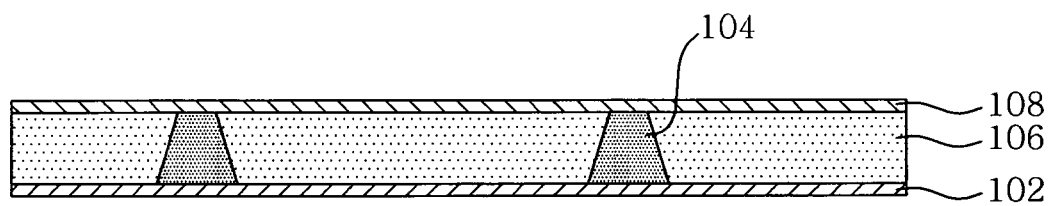

As shown in FIG. 10, second metal layers 108 are applied onto the insulating layer 106.

At this point, the second metal layer 108 is formed in a manner such that the insulating layer 106 and the bumps 104 are heated to a temperature higher than a softening temperature thereof under a vacuum condition and are thus semi-cured, and then the second metal layer 108 is pressed onto the semi-cured components using a press plate such as a stainless steel plate with a flat surface. By the pressing of the second metal layer 108, the second metal layer 108 is connected to the bumps 104.

In this regard, since the second metal layer 108 is pressed by the press plate having a flat surface, the pressure of the press plate is evenly transmitted to the insulating layer 106, thus preventing warping or twisting from occurring throughout the substrate. Furthermore, since the pressing is executed under vacuum conditions, there is no occurrence of voids in the insulating layer 106.

Figure 11:
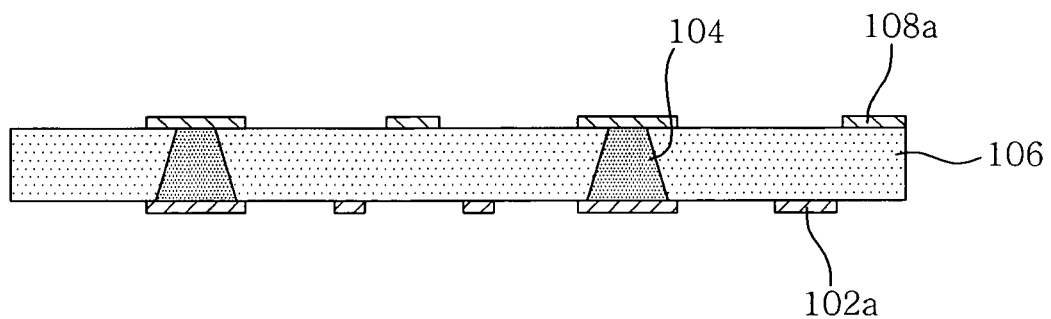

As shown in FIG. 11, the first metal layer 102 and the second metal layer 108 are patterned to create a first circuit layer 102a and a second circuit layer 108a each having a connection pad.

At this point, the first circuit layer 102a and the second circuit layer 108a may be created using a typical process such as a subtractive process. Specifically, the first circuit layer 102a and the second circuit layer 108a may be created in a manner such that dry films are applied onto the first metal layer 102 and the second metal layer 108 and then the first and second metal layers 102 and 108 are subjected to exposure, development and etching processes in this order.

In this regard, the first circuit layer 102a and the second circuit layer 108a are formed on the semi-cured insulating layer 106. The reason for this is because the first circuit layer 102a, the second circuit layer 108a and insulating materials 110a, 110b which are described below must be embedded in the insulating layer 106.

Figure 12:
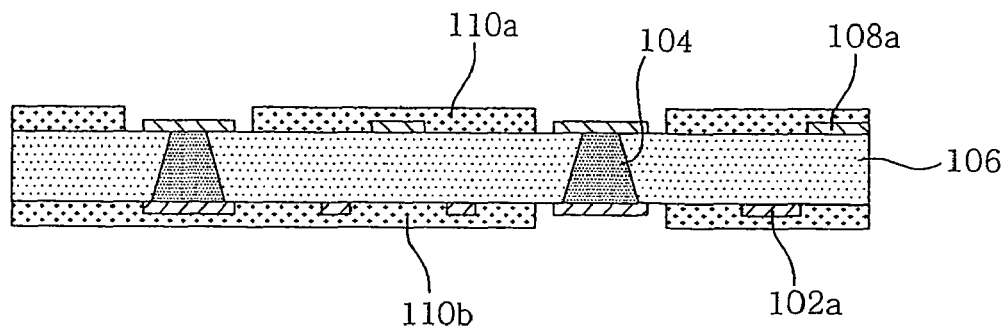

As shown in FIG. 12, the insulating materials 110a, 110b having openings through which the insulating layer 106 is exposed are formed on the insulating layer 106.

The insulating materials 110a, 110b, which are provided so as to serve as solder resist layers for protecting the first and second circuit layers 102a, 108a, may be made of a photosensitive insulating material that has a higher reliability than a general solder resist material and which allows for provision of openings by a simple process. Specifically, this procedure may be implemented by applying photosensitive insulating material 110a, 110b onto the insulating layer 106 and subjecting the photosensitive insulating material to exposure and development processes to form the openings through which the connection pads are exposed.

Furthermore, the insulating materials 110a, 110b applied to the insulating layer 106 may have a thickness exceeding that of the first circuit layer 102a and the second circuit layer 108a so as to protect the first and second circuit layer 102a, 108a from the external environment.

Figure 13:
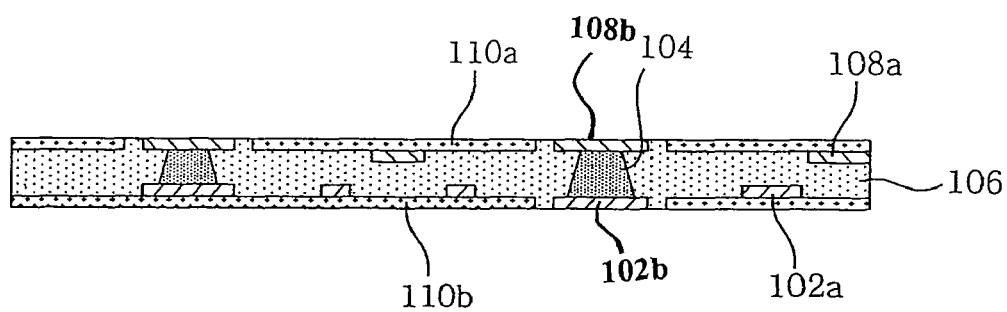

Finally, as shown in FIG. 13, the first and second circuit layers 102a, 108a including the connection pads 102b and 108b and the insulating materials 110a, 110b are pressed and are thus embedded in the insulating layer 106.

At this point, the embedding procedure is implemented by pressing the first and second circuit layers 102a, 108a and the insulating materials 110a, 110b into the semi-cured insulating layer 106 using a press plate such as a flat stainless steel plate.

In this regard, the connection pads of the first and second circuit layers 102a, 108a are embedded in the insulating layer 106 such that outer surfaces thereof are flush with the surface of the insulating layer 106. In other words, one side of each of the connection pads is flush with the surface of the insulating layer 106 and acts as an exposed surface on which an external connection terminal such as a solder ball is bonded, and the other side of the connection pad is embedded in the insulating layer 106.

The insulating materials 110a, 110b are also embedded in the insulating layer 106 with their external surfaces flush with the surface of the insulating layer 106. In other words, one side of each of the insulating materials 110a, 110b is flush with the surface of the insulating layer 106, and the other side of the insulating materials is embedded in the insulating layer 106.

At this point, the first and second circuit layers 102a, 108a excluding the connection pads thereof are embedded in the insulating layer 106 so as not to be exposed to the external environment. In this procedure, the insulating materials 110a, 110b may be deformed by the pressing force of the press plate and the repulsion force of the insulating layer 106 against the pressing force so that the first and second circuit layers 102a, 108a are disposed on the internal surfaces of the insulating materials 110a, 110b. Alternatively, the insulating materials 110a, 110b and the first and second circuit layers 102a, 108a may be embedded in the insulating layer 106 without their initial configuration being changed, as shown in FIG. 14. Although the first and second circuit layers 102a, 108a are shown in FIG. 14 as being entirely embedded in the insulating materials 110a, 110b, the first and second circuit layers 102a, 108a may be partially embedded in the insulating materials 110a, 110b.

Although the preferred embodiment of the present invention has been disclosed for illustrative purposes, those skilled in the art will appreciate that the printed circuit board and the method of manufacturing the same are not limited thereto and that various modifications, additions and substitutions are possible, without departing from the scope and spirit of the invention as disclosed in the accompanying claims. Accordingly, such modifications, additions and substitutions should also be understood as falling within the scope of the present invention.

What is claimed is:

1. A printed circuit board comprising:
   an insulating layer;
   at least one circuit layer embedded in the insulating layer and having a connection pad that is embedded in the insulating layer such that one side of the connection pad is flush with a surface of the insulating layer; and
   insulating materials configured to protect the circuit layer from an external environment and having an opening through which the connection pad is exposed,
   wherein the insulating materials are flush at one side with the insulating layer and are embedded at the other side in the insulating layer.

2. The printed circuit board according to claim 1, wherein the at least one circuit layer includes a first circuit layer disposed on one side of the insulating layer and a second circuit layer disposed on the other side of the insulating layer, and
   wherein the insulating layer includes a bump for connecting the first circuit layer with the second circuit layer.

3. The printed circuit board according to claim 1, wherein the one side of the connection pad which is flush with the insulating layer acts as an exposed surface to which an external terminal is bonded.

4. The printed circuit board according to claim 1, wherein the at least one circuit layer is formed on the other side of the insulating materials and is embedded in the insulating layer.

5. The printed circuit board according to claim 1, wherein the at least one circuit layer is embedded in the insulating materials.

6. The printed circuit board according to claim 1, wherein the insulating materials include photosensitive insulating materials.

* * * * *